United States Patent
Bensahel et al.

(10) Patent No.: US 7,884,352 B2
(45) Date of Patent: Feb. 8, 2011

(54) SINGLE-CRYSTAL SEMICONDUCTOR LAYER WITH HETEROATOMIC MACRONETWORK

(75) Inventors: Daniel Bensahel, Grenoble (FR); Yves Campidelli, Grenoble (FR); Oliver Kermarrec, Gieres (FR)

(73) Assignees: STMicroelectronics S.A., Montrouge (FR); STMicroelectronics Crolles 2 SAS, Crolles (FR)

( * ) Notice: Subject to any disclaimer, the term of this patent is extended or adjusted under 35 U.S.C. 154(b) by 943 days.

(21) Appl. No.: 10/583,235

(22) PCT Filed: Dec. 16, 2004

(86) PCT No.: PCT/FR2004/050713

§ 371 (c)(1),
(2), (4) Date: May 10, 2007

(87) PCT Pub. No.: WO2005/059978

PCT Pub. Date: Jun. 30, 2005

(65) Prior Publication Data

US 2007/0248818 A1    Oct. 25, 2007

(30) Foreign Application Priority Data

Dec. 16, 2003   (FR)   .................................. 03 51073

(51) Int. Cl.
*H01L 31/00*    (2006.01)

(52) U.S. Cl. .............................. 257/19; 257/18; 257/12; 257/15

(58) Field of Classification Search .................. 257/14, 257/15, 20, 12, 18, 19
See application file for complete search history.

(56) References Cited

U.S. PATENT DOCUMENTS

| 6,037,614 A * | 3/2000 | He et al. ..................... 257/184 |
| 2002/0013042 A1 | 1/2002 | Morkoc |
| 2002/0039833 A1 | 4/2002 | Bensahel et al. |
| 2003/0073258 A1 | 4/2003 | Mukai et al. |

FOREIGN PATENT DOCUMENTS

DE    100 19 712 A1    10/2001

OTHER PUBLICATIONS

International Search Report from corresponding International Application No. PCT/FR2004/050713, filed Dec. 16, 2004.

* cited by examiner

*Primary Examiner*—Thinh T Nguyen
(74) *Attorney, Agent, or Firm*—Lisa K. Jorgenson; James H. Morris; Wolf, Greenfield & Sacks, P.C.

(57) ABSTRACT

The invention relates to a single-crystal layer of a first semiconductor material including single-crystal nanostructures of a second semiconductor material, the nanostructures being distributed in a regular crystallographic network with a centered tetragonal prism.

16 Claims, 2 Drawing Sheets

SINGLE-CRYSTAL SEMICONDUCTOR LAYER WITH HETEROATOMIC MACRONETWORK

FIELD OF THE INVENTION

The present invention relates to the manufacturing of a single-crystal semiconductor layer comprising nanostructures or "quantum dots" of a first single-crystal semiconductor material in a second single-crystal semiconductor material. More specifically, the present invention relates to the forming of nanostructures in a silicon substrate.

DISCUSSION OF THE RELATED ART

Such nanostructures or "quantum dots" are, for example, described in document "Ge/Si self-assembled quantum dots grown on Si (100) in an industrial high-pressure chemical vapor deposition reactor" by C. Hernandez, Y. Campidelli, D. Simon, D. Bensahel, I. Sagnes, G. Patriarche, P. Boucaus, and S. Sauvage, published in J. Appl. Phys., 86/2, 1999, 1145-1148. They are used in a great number of fields. For example, in the field of telecommunications, systems based on optical fibers are increasingly used. For this purpose, emitters capable of converting a potential difference into a light signal and receivers capable of converting a light signal emitted by an optical fiber into an electric signal are used. The emitted and/or received light signal generally is within a wavelength field ranging between 1.4 and 1.5 µm.

Until a recent period, combinations of materials from columns III and V of the periodic table of elements have been used to form such optical receivers and/or emitters. For example, gallium arsenide (AsGa) or indium phosphide (InP). It would however be preferred to use silicon-based materials, but the use of silicon poses different problems. First, the energy band gap of silicon between its valence and conduction bands is relatively small and transitions are of "indirect" type. "Indirect" means that the passing of an electron from the valence band to the conduction band occurs in several jumps and not in a single jump as in the case of the combinations of materials of columns III and V. Silicon is then almost impossible to use as an emitter, that is, as a converter of electric energy into light energy. Indeed, due to the indirect character of electronic transitions, the transitions have a high dissipation and a very low emission. Further, the relatively low energy band gap, on the order of 1.1 eV, corresponds to an emission of photons of a wavelength smaller than 1 µm, is not used much in the field of telecommunications.

It has thus been provided to improve the optical properties, that is, the emission and reception properties, of silicon by forming structures formed of a single-crystal silicon lattice comprising single-crystal germanium nanostructures (quantum dots).

As discussed in the previously-mentioned article, the forming of nanostructures results from a strain-driven mechanism between crystallographic meshes of different, but relatively close, dimensions of two semiconductors. It has been shown that this so-called Stranski-Krastanow growth method for example causes the forming of germanium nanostructures on silicon from various deposition methods comprising molecular epitaxies, low-pressure chemical vapor depositions, or ultrahigh-vacuum chemical vapor depositions.

More specifically, to form germanium quantum dots in silicon, an epitaxy by continuous injection of germane ($GeH_4$) is for example performed on a single-crystal silicon substrate. The first few deposited atom layers form a layer having a regular but non-homogeneous surface. Due to the strain linked to the difference of the crystal lattices, the surface exhibits an sinusoidal-type "wavy" shape. In other words, the upper surface of a germanium layer of a few atomic layers, formed on silicon, exhibits regularly distributed holes and bumps. Such a structure will be designated as being a wavy germanium plane. As the injection of germane carries on, the crystallographic strain—deformations of the natural germanium lattice—cause the growth of nanostructures. This injection must be interrupted when the nanostructures or dots have reached a desired dimension, before a coalescence of the nanostructures occurs, followed by the forming of a continuous layer containing dislocations.

An epitaxial growth of a silicon layer which encapsulates the germanium nanostructures is then performed.

FIG. 1 illustrates, in partial simplified cross-section view, the result of the repeated implementation of such a method. For example, three wavy planes of nanostructures (quantum dots) of germanium 3 encapsulated in silicon 5 have been formed on a silicon substrate 1.

FIG. 2 illustrates, in a partial simplified cross-section view, any of wavy planes 3 of FIG. 1.

It is desired to obtain the highest possible densities of nanostructures ($\geq 10^{10}$ cm$^{-2}$) and the lowest possible dimension dispersion. However, as very schematically illustrated in FIGS. 1 and 2, the current implementation of the Stranski-Krastanow strained growth method results in structures of nanostructures, especially, regarding the dispersion of the nanostructure dimensions (diameter) when the number of formed wavy planes increases.

In particular, the selection of the epitaxy conditions requires a compromise. Indeed, these conditions must be selected for the epitaxy not to be too slow because, in this case, the risks linked to the presence of inevitable impurities (brought by the gas precursors and/or linked to the leakage rate of the reactor) increase. However, if the growth speed of the germanium nanostructures is too high, the process becomes difficult to control. Indeed, this growth must be interrupted precisely, as indicated previously.

Thus, for given gas pressure, flow rate, and dilution conditions, in a given reactor, an "optimal" temperature which corresponds to a maximum "controllable" growth speed, that is, a speed which is as high as possible to avoid the above-mentioned defects, and which is sufficiently low to enable interrupting the epitaxy precisely at a desired stage (for example, a few tens of monoatomic layers), is defined.

The present inventors have already regularized the distribution of nanostructures from one plane to another and decreased the dispersion of their dimensions by forming privileged nucleation sites by an injection at the surface of substrate 1 of a puff of germane before the growth of the first plane of nanostructures.

However, although the distribution and the dimension of nanostructures are improved, said nanostructures are not perfectly regular. Thus, the present inventors have found that, on forming of a few planes of necessary nanostructures, generally from five to twenty, nucleation sites are "skipped" and replaced with dislocations which grow vertically. Further, not all the sites are equivalent, which results in an irregular distribution and in a more significant dispersion of dimensions.

Further, the doubly heterogeneous character of the structures obtained up to now limits possible applications. In particular, known devices exhibit a low emissivity.

SUMMARY OF THE INVENTION

The present invention aims at providing a single-crystal semiconductor layer comprising regularly distributed single-crystal semiconductor nanostructures.

The present invention aims at providing such a layer in which the nanostructures exhibit a limited dimension dispersion.

To achieve these and other objects, the present invention provides a single-crystal layer of a first semiconductor material comprising single-crystal nanostructures of a second semiconductor material, the nanostructures being distributed according to a regular centered tetragonal mesh crystal lattice.

According to an embodiment of the present invention, the first semiconductor material is silicon and the second semiconductor material is germanium.

According to an embodiment of the present invention, the height of the tetragonal mesh is equal to the sum of two equal elementary values selected from a range of from 60 to 80% of the nanostructure diameter up to four times the diameter.

According to an embodiment of the present invention, the planar base of the centered tetragonal mesh is substantially square and exhibits a side of a value ranging between 50 and 300 nm.

The present invention also provides a light source, comprising a layer according to any of the preceding embodiments associated with an electric excitation circuit.

According to an embodiment of the present invention, the source forms a coherent source.

According to an embodiment of the present invention, the source forms a diode.

The present invention also provides a light-trapping device, comprising a layer according to any of the preceding embodiments.

The present invention also provides a photodetector, comprising such a device.

The present invention also provides a diffractor of a light or acoustic wave, comprising a layer according to any of the preceding embodiments.

The present invention also provides an optical or acoustic filter, comprising a layer according to any of the preceding embodiments.

The foregoing and other objects, features, and advantages of the present invention will be discussed in detail in the following non-limiting description of specific embodiments in connection with the accompanying drawings.

DETAILED DESCRIPTION

Figure 1:
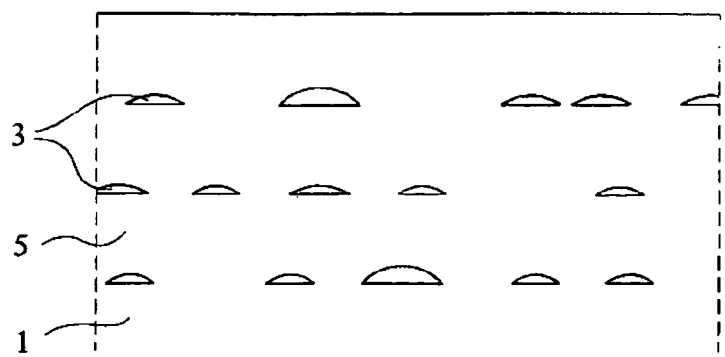
FIG. 1, previously described, illustrates in partial simplified cross-section view a structure according to the state of the art.

For clarity, the various drawings are not to scale. Further, the same elements are designated with the same reference numerals in the different drawings.

The present invention takes advantage of the studies of the inventors on nanostructures of a first semiconductor material encapsulated in a layer of a second semiconductor material.

By studying a structure comprising such germanium nanostructures encapsulated in silicon, the present inventors have determined a law of variation of the relative positions of the germanium nanostructures of two successive planes according to the silicon thickness separating them.

Figure 3:
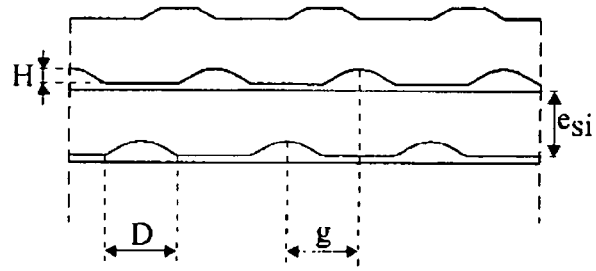
FIG. 3 illustrates in partial simplified cross-section view a semiconductor layer according to the present invention.
Figure 4:
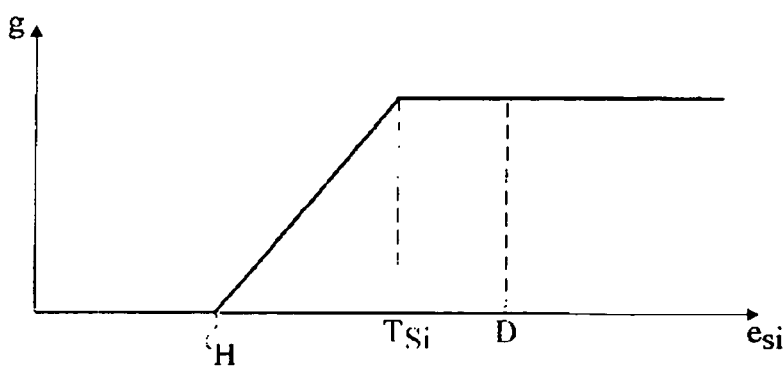
FIG. 4 is a simplified dispersion curve of nanostructures according to a silicon thickness.

FIG. 3 illustrates, in a partial simplified cross-section view, wavy planes of germanium nanostructures encapsulated in silicon. FIG. 4 partially and schematically illustrates a dispersion curve of the nanostructures according to the silicon thickness separating two planes of nanostructures.

The wavy planes of germanium nanostructures encapsulated in silicon are obtained by repeating successive depositions of germanium on a single-crystal semiconductor substrate (for example, silicon), then of silicon. The silicon deposited second is used as a substrate for the next successive germanium deposition. The epitaxy conditions of germanium are known, for example, described by Stranski-Krastanow. The strain of the epitaxial growth of silicon will be described subsequently.

FIG. 3 illustrates the structure obtained when, for identical conditions of epitaxial growth of germanium nanostructures, the silicon thickness $e_{Si}$ then deposited by epitaxy and separating two wavy Stranski-Krastanow planes is set to a precise value selected from a predetermined range. The epitaxy conditions are selected so that the nanostructures have a diameter D approximately ranging from 40 to 200 nm and a height H approximately ranging from 10 to 30 nm. The nanostructures rest on a thick planar germanium layer of a few nanometers, typically from 2 to 4 nm. FIG. 4 illustrates gap g in the plane of FIG. 3 of the germanium nanostructures of an upper plane with respect to a lower plane according to thickness $e_{Si}$ of the intermediary silicon layer deposited between each plane.

As illustrated in FIGS. 3 and 4, when thickness $e_{Si}$ is greater than threshold $T_{Si}$, gap g is maximum, and each nanostructure of an upper plane is then laterally equidistant, in cross-section view, from two nanostructures of the lower plane. The inventors have found that the maximum gap effect appears before thickness $e_{Si}$ reaches the value of diameter D of the nanostructures and maintains at least up to this value, up to much higher values, twice or three times diameter D and that can reach four times diameter D. "Four times diameter D of the nanostructures" means four times the value of the diameter to within some thirty percents (±30%). The inventors' studies have shown that according to the growth conditions, threshold value $T_{Si}$ is equal to from sixty to eighty percent of the value of diameter D of the nanostructures.

Figure 5:
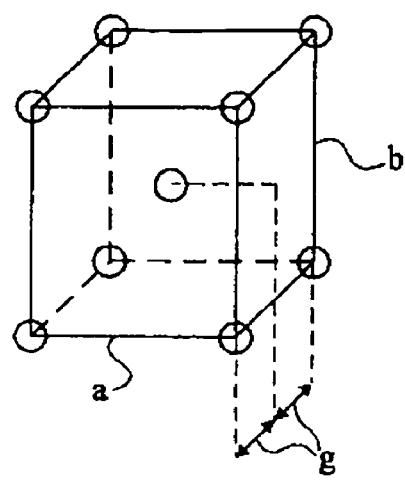
FIG. 5 illustrates, in partial simplified perspective view, the mesh of the macrolattice of a layer according to the present invention.

FIG. 5 partially shows three planes of nanostructures of a layer according to the present invention. As illustrated in this drawing, when silicon thickness $e_{Si}$ is greater than threshold $T_{Si}$, the nanostructures are self-organized in the layer volume according to a regular pattern of the macrolattice in the layer. Indeed, as indicated previously, the distribution of the nanostructures or quantum dots of germanium in silicon is then perfectly homogeneous. The nanostructures of a first given plane are laterally equidistant from the nanostructures of a second higher plane, themselves laterally equidistant from the nanostructures of a third superposed plane. Considering an assembly of three successive nanostructure planes, said nanostructures are distributed according to a regular centered tetragonal mesh lattice. The base surface of the mesh is substantially square, the nanostructures of a plane being equidistant, separated by a distance a substantially equal to lateral gap g multiplied by the square root of two. Height b of the mesh is substantially equal to twice thickness $e_{Si}$. In the considered example of germanium nanostructures embedded in silicon, side a of the square base of the mesh of the macrolattice exhibits a value ranging between 50 and 300 nm.

It should be understood by those skilled in the art that the value of maximum gap g and thus of side a of the square base of the mesh of the macrolattice is essentially set by the dimensions of the germanium nanostructures and in particular by their diameter. As indicated previously in relation with FIG. 3, it is considered that successive wavy planes are formed in the same epitaxial growth conditions. In practice, the inventors' measurements have shown that the value of maximum gap g is on the order of diameter D of the nanostructures to within a few percents.

It should also be noted that, for a given layer, silicon thicknesses $e_{Si}$ separating two successive wavy planes are equal, selected in the range from threshold $T_{Si}$ to four times the nanostructure diameter.

Further, the inventors have determined that the dispersion of the nanostructure dimensions is then extremely low, lower than that conventionally obtained.

Figure 6:
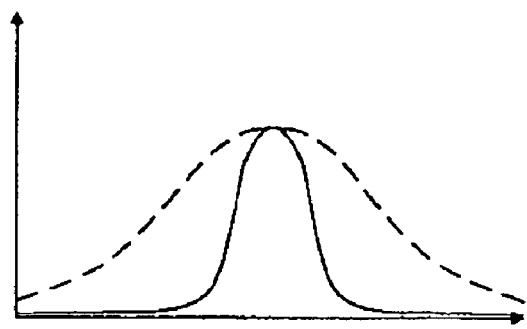
FIG. 6 is a simplified curve of distribution of the nanostructure dimensions.

FIG. 6 partially and schematically illustrates the dimension distribution of the nanostructures. The curve in dotted lines shows the dimension distribution of the nanostructures in the known structure of FIGS. 1 and 2. The curve in full lines shows the dimension distribution of the nanostructures in a layer according to the present invention. The comparison of these two curves shows that the nanostructure distribution in a layer according to the present invention is narrower.

A single-crystal semiconductor layer exhibiting a regular macrolattice of nanostructures of a single-crystal semiconductor material in another single-crystal semiconductor material will have a great number of applications.

For example, in the field of telecommunications, the layer comprising the macrolattice according to the present invention enables forming devices which are sufficiently sensitive and in an adequate wavelength field to form light signal to electric signal conversion devices.

A layer according to the present invention may be used as a detector or as an emitter of a light signal based on an electric reference value. The regular and homogeneous distribution of the nanostructures according to a centered tetragonal mesh macrolattice and the low dispersion of the nanostructure dimensions especially provides an optimal and stable emissivity at a wavelength with little dispersion around an average wavelength.

A layer according to the present invention may also be used as a light source out of the field of telecommunications. For example, a layer according to the present invention may be used to form a light-emitting diode.

Further, given the regular character of the macrolattice and the homogeneous character of the dimension distribution of the nanostructures, a layer according to the present invention may be used to form a coherent light source such as a laser source.

A layer according to the present invention may be used as a light-trapping device such as a photodetector.

The macrolattice of quantum dots of the layer according to the present invention may also be used as a filter of a sound or light wave.

The macrolattice of the layer according to the present invention is perfectly stable, homogeneous, and reproducible. It may also advantageously be used to diffract a wave. For example, such a macrolattice may form a Bragg diffractor likely to be used to perform a collimation of a beam.

It will be within the abilities of those skilled in the art to adapt the previously-described conditions of manufacturing of a semiconductor layer comprising wavy Stranski-Krastanow planes of a first semiconductor material encapsulated in a second semiconductor material so that the thickness of the second semiconductor material ranges according to the present invention between threshold value $T_{Si}$ and four times the diameter of nanostructures of the first semiconductor material.

According to an embodiment, after forming of the layer comprising such planes, an anneal will be performed at a temperature from 700 to 900° C. Such an anneal is intended to enable a relaxation, that is, a stabilization and a homogenization of the crystal structure.

It will also be within the abilities of those skilled in the art to complete the structure to form any desired device. Thus, in the case of devices for converting light and electric signals, it will be within the abilities of those skilled in the art to complete the structure by means of appropriate electric contacts and, in the case of an emitter, of a source of electric excitation.

A layer according to the present invention will have other applications.

Thus, a layer comprising a macrolattice according to the present invention may be used as an intermediary layer for modifying crystal parameters of a substrate.

Indeed, the upper silicon surface of a layer comprising a macrolattice according to the present invention exhibits a mesh parameter greater than that of a sole silicon layer. Thus, the inventors have determined that the average mesh parameter of a silicon layer encapsulating several wavy germanium planes is equal to the parameter of a heteroatomic SiGe layer comprising on the order of from 30 to 50% of germanium. The inventors have further determined that such a modification of the mesh parameter of silicon is performed across a thickness smaller than that of an SiGe heteroatomic layer with a gradually increasing proportion of germanium providing the same parameter. A silicon layer comprising a macrolattice of the germanium nanostructures can then be used as all or part of a pseudo-substrate, that is, a strained silicon substrate (silicon with an enlarged elementary mesh).

Further, the inventors have determined that the upper surface of such a pseudo-substrate exhibits a decreased defect rate. Indeed the gap of the germanium nanostructures from one level to another of the macrolattice advantageously enables decreasing the vertical propagation of dislocations. Thus, if a dislocation creates in an intermediary silicon layer between two planes of nanostructures, it tends to propagate vertically in a known fashion. In the displacement of the nanostructures on the upper planes, a nanostructure may come across the propagation path of the dislocation and thus interrupt it.

Such a pseudo-substrate will have a great number of applications. Indeed, in a given crystal system, in which the elementary mesh has a determined dimension, the electronic characteristics and especially the mobility of the carriers (electrons/holes) are determined. It has been shown that it might be desirable to modify the mesh parameters to optimize electronic characteristics. In particular, in the case of silicon, it has been shown that, if the dimension of the elementary mesh was increased (the value of the mesh parameter), the forming of elementary components with improved electronic characteristics was made possible.

Figure 7:
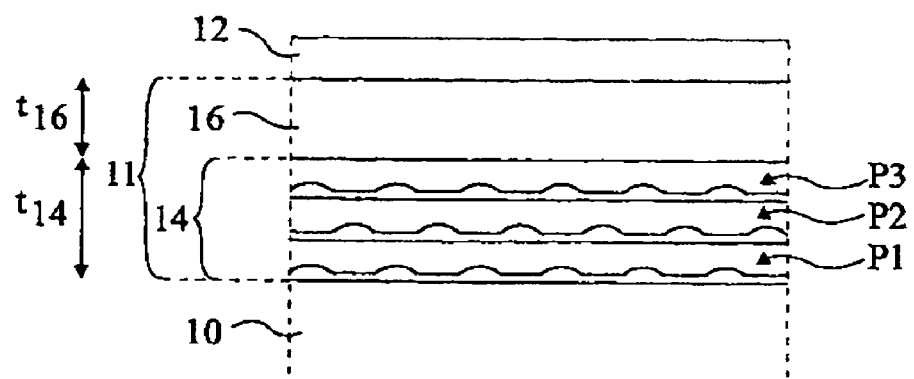
FIG. 7 illustrates an application mode of a layer according to the present invention.

FIG. 7 illustrates, in partial simplified cross-section view, the forming, on a single-crystal silicon substrate 10, of a pseudo-substrate 11 and of a layer 12 of silicon in which electronic components are formed.

According to an embodiment of the present invention, pseudo-substrate 11 comprises a lower portion 14 resting on substrate 10 and an upper portion 16 on which layer 12 rests. Lower portion 14 is formed of several planes P1, P2, and P3 of germanium nanostructures encapsulated in silicon. Upper portion 16 is formed of a heteroatomic SiGe layer comprising a gradually increasing proportion of germanium. Thickness t14 of lower portion 14 is smaller than the thickness of a gradual SiGe layer exhibiting a proportion of 50% of germanium at the surface. Thickness t16 of upper portion 16 is adjusted to obtain the mesh parameter corresponding to a given proportion of germanium in a silicon lattice, ranging between 50 and 100%. The general thickness of pseudo-substrate 11 is thus advantageously smaller than that of a simple gradual layer.

The need to implement a growth of Stranski-Krastanow type in nanostructure planes does not lengthen the manufacturing times since it can be performed in the epitaxy reactor used for the growth of the gradual layer. In practice, the time required to grow the few necessary nanostructure planes is shorter than the time necessary to grow a pseudo-substrate of the same final mesh parameter. In practice, the number of planes of nanostructures is on the order of from one to fifteen, preferable from one to ten to limit as much as possible the vertical propagation of dislocations.

Figure 2:
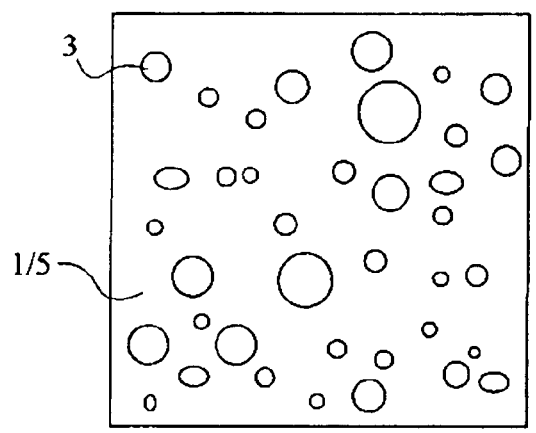
FIG. 2, previously described, illustrates in partial simplified top view one of the planes of the structure of FIG. 1.

In terms of defects, the inventors have determined that the surface density of defects of lower portion 14 is then decreased, and is on the order of from 10 to $10^3$/cm$^2$ instead of from $10^4$ to $10^6$/cm$^2$ for a gradual layer (2, FIG. 1). As will be described in detail hereafter in relation with FIGS. 3A-C and 4, such a decrease is linked to a stop of the vertical propagation of the dislocations in the silicon on the nanostructures.

It should be noted that layer 12 may be formed directly on a layer 11 only formed of its lower portion 14 comprising a macrolattice of germanium nanostructures in silicon.

According to a variation, the last silicon layer of lower portion 14 may be used directly as a substrate instead of layer 12.

Further, the macrolattice translates above the nanostructures of the last plane as islands having the shape of a truncated faceted pyramid. When the silicon thickness $e_{Si}$ is greater than threshold $T_{Si}$, in top view, the pyramids are "self-organized" at the surface in a regular form in a regular tablecloth, having squares with dimensions on the order of diameter D of the nanostructures. Short of threshold $T_{Si}$, the self-organization is less regular, the islands or the gaps between islands having a dimension, in top view, greater than diameter D. Such a regular surface may be advantageous in a number of applications.

An example of such an application is the forming of memories using MOS-type transistors comprising a floating gate. Indeed, in such a device, it has been acknowledged that it was desirable for the floating gate of the transistor to be formed of distinct conductive elements embedded in an insulating layer. For this purpose, a multiple plane pseudo-substrate may advantageously be used according to the present invention. Thus, the silicon is oxidized, after which a conductive material is deposited. During the oxidation, the irregular shape of the surface comprising truncated faceted pyramidal islands is kept. The islands or the depressions between islands are then used as nucleation points of nanocrystals in the subsequent deposition. These nanocrystals then form the floating gate.

According to a variation, the oxide is an insulator with a strong dielectric permittivity.

Of course, the present invention is likely to have various, alterations, improvements, and modifications which will readily occur to those skilled in the art. In particular, the dimensions of the nanostructures and of the silicon layers separating two planes of nanostructures may be modified in any appropriate fashion, provided that the silicon thickness remains within the defined range. Further, the present invention is not limited to the specific examples of the preceding description. In particular, the nature of the considered materials may be modified. Thus, it has been considered that the layer according to the present invention is formed on a single-crystal semiconductor silicon substrate. However, the substrate may be a silicon-germanium or germanium substrate. Similarly, a layer comprising germanium nanostructures embedded in silicon has been considered, however the present invention also concerns a layer of silicon nanostructures embedded in germanium. Further, the present invention is not limited to a silicon-based process, but applies to any technological process using a layer of single-crystal semiconductor nanostructures of a given material embedded in another single-crystal semiconductor material, one of the two materials being a binary or ternary alloy of elements selected from among the materials of column III of the periodic table of elements and the other material being another binary or ternary alloy of elements selected from among the material of column V. Such a layer would, for example, be a layer of nanostructures of an indium, gallium, and arsenic alloy (InGaAs) in a gallium arsenide (GaAs) or indium phosphide (InP) substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is

1. A device, comprising:
a single-crystal layer of a first semiconductor material, the single-crystal layer of the first semiconductor material including a plurality of single-crystal nanostructures of a second semiconductor material, wherein the plurality of single-crystal nanostructures are distributed according to a regular centered tetragonal mesh crystal lattice.

2. The device of claim 1, wherein the first semiconductor material is silicon and the second semiconductor material is germanium.

3. The device of claim 2, wherein a height of the tetragonal mesh is equal to a sum of two equal elementary values selected from a range of from 60% to 80% of an average diameter of the plurality of nanostructures up to four times the average diameter of the plurality of nanostructures.

4. The device of claim 2, wherein a planar base of the regular centered tetragonal mesh is substantially square and exhibits a side value ranging between approximately 50 nm and approximately 300 nm.

5. A semiconductor device, comprising:
a single-crystal layer of a first semiconductor material; and
a plurality of single-crystal nanostructures of a second semiconductor material, the plurality of nanostructures of the second semiconductor material being encapsulated in the layer of the first semiconductor material, wherein the plurality of nanostructures of the second semiconductor material are distributed according to a regular centered tetragonal mesh lattice.

6. The device of claim 5, wherein the device cooperates with an electric excitation circuit to provide a light source.

7. The device of claim 6, wherein the light source in cooperation with the electric excitation circuit forms a coherent source.

8. The device of claim 6, wherein the light source in cooperation with the electric excitation circuit forms a diode.

9. The device of claim 5, wherein the device is configured as a light-trapping device.

10. The device of claim 8, wherein the light-trapping device comprises a photodetector.

11. The device of claim 5, wherein the device comprises a diffractor of a light or acoustic wave.

12. The device of claim 5, wherein the device comprises an optical or acoustic filter.

13. The device of claim 5, wherein the first semiconductor material is silicon and the second semiconductor material is germanium.

14. The device of claim 5, wherein a height of the tetragonal mesh approximates a sum of two approximately equal elementary thicknesses selected from a range of from approximately 60% to approximately 80% of a diameter of a nanostructure to approximately four times the diameter of the nanostructure.

15. The device of claim 5, wherein the regular centered tetragonal mesh comprises a substantially square base, the substantially square base exhibiting a side dimension ranging between approximately 50 nm and approximately 300 nm.

16. The device of claim 5, wherein the plurality of nanostructures comprise quantum dots.

* * * * *